Figure 1:
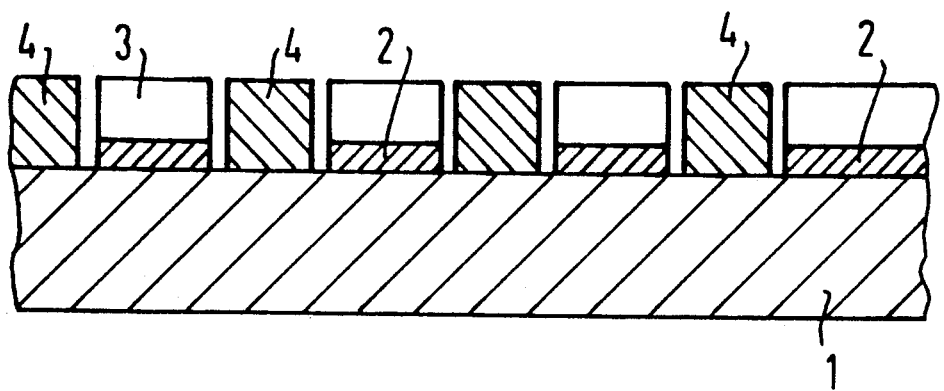

United States Patent [19]
Maiwald

[11] Patent Number: 5,271,548
[45] Date of Patent: Dec. 21, 1993

[54] METHOD FOR APPLYING SOLDER TO AND MOUNTING COMPONENTS ON PRINTED CIRCUIT BOARDS

[75] Inventor: Werner Maiwald, Bad Aibling, Fed. Rep. of Germany

[73] Assignee: Siemens Aktiengesellschaft, Munich, Fed. Rep. of Germany

[21] Appl. No.: 929,975

[22] Filed: Aug. 14, 1992

[30] Foreign Application Priority Data

Aug. 14, 1991 [DE] Fed. Rep. of Germany ....... 4126913

[51] Int. Cl.$^5$ .............................................. H05K 3/34
[52] U.S. Cl. .................................. 228/175; 228/254
[58] Field of Search ............... 228/180.2, 175, 206, 228/223, 254

[56] References Cited

U.S. PATENT DOCUMENTS

| 4,208,005 | 6/1980 | Nate et al. .................. 427/96 X |
| 4,738,732 | 4/1988 | Anderson et al. .................. 148/23 |
| 4,752,027 | 6/1988 | Gschwend . |
| 4,821,948 | 4/1989 | Fisher et al. .................. 228/223 |
| 5,051,339 | 9/1991 | Friedrich et al. . |
| 5,145,531 | 9/1992 | Turner et al. .................. 148/23 |

FOREIGN PATENT DOCUMENTS

| 0322121 | 6/1989 | European Pat. Off. . |
| 0324194 | 7/1989 | European Pat. Off. . |
| 115344 | 9/1980 | Japan .................. 228/180.2 |
| 1100993 | 4/1989 | Japan . |
| 2113596 | 4/1990 | Japan . |
| 2251196 | 10/1990 | Japan . |
| 255650 | 5/1991 | Japan . |
| 2037489 | 7/1980 | United Kingdom . |

OTHER PUBLICATIONS

M. Kunze "Baugreppenrationalisiering und Obertlcichenmontage" Aug. 1987, radiofernsehen, electronic, pp. 479-483.

*Primary Examiner*—Kenneth J. Ramsey
*Attorney, Agent, or Firm*—Herbert L. Lerner; Laurence A. Greenberg

[57] ABSTRACT

A method for applying solder to and mounting components on printed circuit boards, includes applying a solder paste to electrically conductive regions of a printed circuit board to form solder deposits, and subsequently melting the solder deposits into solder applications joined to the conductive regions. The components are joined to the printed circuit board with an adhesive applied to the printed circuit board between the electrically conductive regions, while assigning each of the electrically conductive regions to a respective one of the components. A flux is applied and a soldering process is performed.

11 Claims, 1 Drawing Sheet

METHOD FOR APPLYING SOLDER TO AND MOUNTING COMPONENTS ON PRINTED CIRCUIT BOARDS

The invention relates to a method for applying solder to printed circuit boards and for mounting components on the printed circuit boards, in which a solder paste is applied to electrically conductive regions (soldering pads) of a printed circuit board for forming solder deposits, and in which the solder deposits are subsequently melted to make solder applications that are joined to the conductive regions.

In the manufacture of electronic equipment, the surface mounting of components has gained substantial importance as compared with contact hole mounting. The greater packing density of surface mounted components (SMCs) on printed circuit boards (PCBs) demands that the spacing between the components be decreased and demands smaller-sized soldering spots and therefore requires a greater number of soldering spots on each PCB. As a result, and because checking of the PCBs is more difficult, there is a great need for the most perfect soldering of the components that is possible. Moreover, in the surface mounting of components, the quality of the materials being used in the soldering process has greater significance than with conventional soldering methods.

Conventional wave soldering processes that are used, for instance, in assembling PCBs with components inserted into mounting holes, are only suited to a limited extent for the purpose of the surface mounting of components. In the case of components that are preferably secured to the PCB with an adhesive, the solder application is performed by wave soldering with a wave of solder that is delivered to the back side of the PCB. Applying the solder and producing a soldered lead to lead contacts of the component are performed simultaneously, because the solder is molten. Due to problems in carrying out such a method, for instance because of oxidation of the solder, and due to increasingly reduced dimensions, adequately reliable soldered leads cannot be attained with such a method for surface mounted components.

In surface mounted technology (SMT), directly processable PCBs offer major advantages. Reflow-solderable SMD printed circuit boards, with solder having been applied previously, are then equipped immediately with surface mounted devices. The contact or conductor leads of the components are aligned with respect to corresponding contact leads of a substrate or of the PCB and are soldered by the reflow soldering process. The solder must have sufficiently high quality to moisten the contact leads of the component and to fill in all of the interstices between the contact leads of the component and the PCB.

German Patent DE 38 10 653 C1, corresponding to U.S. Pat. No. 5,051,339, discloses several methods for applying solder to printed circuit boards with components. In immersion application of solder to printed circuit boards, a prepared PCB is dipped in a bath of solder, then removed and cooled. The metallized regions of the PCB that are not provided with a solder resist agent then receive an application of solder. However, because of the surface tension of the solder, curved surfaces approximately in the form of a hump are produced. The height of the solder application depends on the dimensions in the PCB plane, so that solder applications of different heights are created. An ensuing leveling process, using a hot-air stream, is very complicated and involves problems since, for instance, it uses flux, which will be expensive to dispose of in the future. There are some disadvantages to bounding the electrically conductive regions (soldering pads) of the PCB with a boundary layer of defined thickness that prevents the application of solder to permit the thus-prepared PCB to still be covered with a closure element in the immersion bath, so that after it has been removed and cooled, uniformly high solder applications are created. For instance, the boundary layer must be removed from the surface of the PCB again, either mechanically or chemically. That makes such a process very complicated and expensive, because a temporary solder resist mask must be used which must simultaneously be removable and heat-proof. Moreover, the immersion process dictates a considerable temperature load on the PCB. Finally, chemical detachment of the boundary layer, for instance by an alkali washing process, can possibly cause subsequent damage.

A method is also known in which solder paste that forms flat solder deposits is applied to the SMD soldering regions or pads with the aid of a printing process (such as screen printing) or as dispensing process. In order to avoid contact bridges, it is known, for instance from Patents Abstracts of Japan, Vol. 14, No. 336 (E-953) [4279], July 19, 1990, to apply a solder resist mask between the soldering pads. After the PCB which is provided with the solder deposits has been equipped with components, the solder deposits are then heated relatively slowly in a reflow oven to a point above the melting point of the solder alloy being used, and the soldered lead is thus produced by the melting of the solder paste. However, that method is especially problematic because the solder paste is not solid but instead has a high proportion of volatile, non-metallic ingredients, such as solvents. In the soldering process, the non-homogeneous solder being supplied can lead to soldered joints of reduced quality, and moreover it lengthens the course of the process, since the volatile components must be evaporated out gradually by slow heating.

U.S. Pat. No. 4,752,027 discloses a method for applying solder to PCBs with components, in which solder paste is applied by screen printing or matrix printing to solder pads, then dried in the oven and reflow-treated. The thus-obtained pattern on the PCB, with convex soldering spots, is carefully cleaned before the PCB is processed with rollers that press the surfaces of the soldered spots flat and level them. After that, adhesive flux is applied to the soldered spots, to establish an adhesion contact between the soldered spots and the leads of the component in the course of equipping the thus-pretreated PCB with components.

In that method of adhesively sticking components to the solder pads with a flux, such as resin, a problem which can arise, especially with small components, is that they can tip up, for example because of asymmetry. In that case, it is impossible to apply solder, or only poor soldering of the lead contacts of the component can be carried out, so that the lead contacts then stick up into the air, resulting in a defective soldered connection. That effect is especially pronounced when a PCB is equipped with components on both sides. The correspondingly pretreated PCB can also be processed only within a limited time of approximately one day, since the solid solder ingredients located on the soldering pads and the flux with adhesive ingredients afford optimal soldering conditions only within that period of time, because of the necessary melting. Moreover, the assembled, soldered PCB and components must be washed after the soldering process to remove the flux residues. Given large-scale production, that represents a considerable load on the environment.

It is accordingly an object of the invention to provide a method for applying solder to and mounting components on printed circuit boards, which overcomes the hereinafore-mentioned disadvantages of the heretofore-known methods of this general type.

With the foregoing and other objects in view there is provided, in accordance with the invention, a method for applying solder to and mounting components on printed circuit boards, which comprises applying a solder paste to electrically conductive regions of a printed circuit board to form solder deposits; subsequently melting the solder deposits into solder applications joined to the conductive regions; joining components to the printed circuit board with an adhesive applied to the printed circuit board between the electrically conductive regions, while assigning each of the electrically conductive regions to a respective one of the components; applying a flux; and performing a soldering process.

An advantage of the invention is that all of the components, even small ones, are joined so securely to the PCB before the soldering process that good, reliably soldered connections can be produced. Moreover, there is the advantage of permitting the components joined to the PCB to be treated with a low solid (LS) flux, so that washing of the component assembly is no longer necessary after the soldering process, which means that the overall method is simplified. Moreover, the component that is joined to the PCB is also moistened with flux upon immersion, which improves the soldered spot. PCBs with components mounted on both sides enable an application of flux and performance of the soldering process simultaneously on both sides of the board. Finally, the method of the invention permits longer processing times, since the application of the solder paste and the formation of solder deposits, including the joining of the PCB to components, can be done independently of the application of the flux. This means simpler checking after the various method steps. There are no restrictions as compared with previously known methods, because in principle any flux can be used, so that with components that are problematic to solder, even aggressive fluxes can be used, although in that case washing of the PCB is necessary after the soldering process. The invention is preferably suited to SMDs, although other components can also be used.

In accordance with another mode of the invention, there is provided a method which comprises flattening the solder applications prior to joining the components to the printed circuit board.

In accordance with a further mode of the invention, there is provided a method which comprises applying the adhesive in the form of one adhesive spot per component.

In accordance with an added mode of the invention, there is provided a method which comprises applying the adhesive with a mask.

In accordance with an additional mode of the invention, there is provided a method which comprises applying the adhesive with a dispenser.

In accordance with yet another mode of the invention, there is provided a method which comprises joining the components to the printed circuit board by curing the adhesive.

In accordance with yet a further mode of the invention, there is provided a method which comprises applying the flux by immersion of the printed circuit board having the glued-on components.

In accordance with yet an added mode of the invention, there is provided a method which comprises applying the flux by spraying the printed circuit board having the glued-on components.

In accordance with yet an additional mode of the invention, there is provided a method which comprises applying a low solid flux.

In accordance with a concomitant mode of the invention, there is provided a method which comprises gluing the components in the form of surface mounted devices to the printed circuit board or to a solder resist mask on the printed circuit board.

Other features which are considered as characteristic for the invention are set forth in the appended claims.

Although the invention is illustrated and described herein as embodied in a method for applying solder to printed circuit boards and for mounting components on the printed circuit boards, it is nevertheless not intended to be limited to the details shown, since various modifications may be made therein without departing from the spirit of the invention and within the scope and range of equivalents of the claims.

The method of operation of the invention, however, together with additional objects and advantages thereof will be best understood from the following description of specific embodiments when read in connection with the accompanying drawings.

Figure 2:
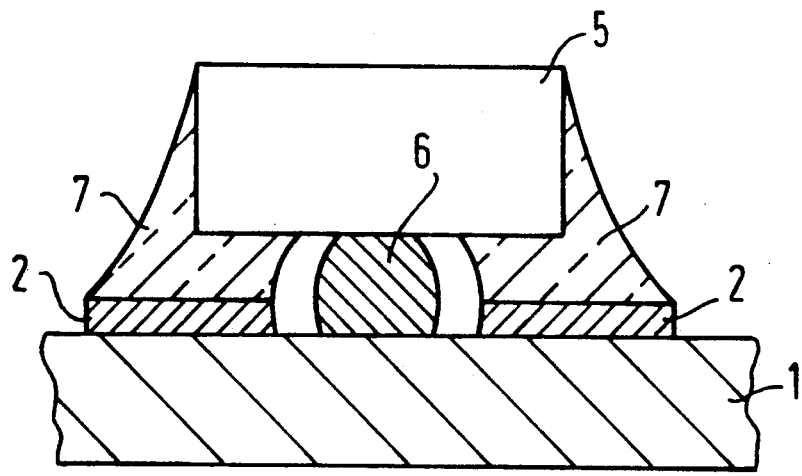

FIG. 1 is a fragmentary, diagrammatic sectional view of a printed circuit board with solder deposits; and FIG. 2 is a fragmentary sectional view of a printed circuit board with a completed, soldered surface mounted component.

Referring now to the figures of the drawing in detail and first, particularly, to FIG. 1 thereof, there is seen a printed circuit board 1 with solder applied, which includes first a basic material onto which a conductive copper lining or soldering pads 2 is applied in a known manner at points intended as SMD soldering regions. The soldering pads 2 may be bounded by a solder resist or stop mask 4 of plastic. In order to form solder deposits, solder paste is applied to the solder pads 2. This is advantageously done with the aid of screen printing or metal templates within the context of the known, economical printing processes. However, application of the solder paste in spot form with the aid of a dispenser is also possible. The flat solder deposits are then melted, for instance by infrared radiation or by heated steam. In this process, the volatile ingredients escape from the solder deposit, resulting in a largely solid solder application that is firmly joined to the applicable soldering pad 2. However, because of surface tension, the solder application may be highly curved, particularly at its surface. If it is additionally necessary for the solder applications to be leveled, then the hump-shaped solder application can be pressed flat with some device, such as a press or roller. Any heat which is supplied can reinforce this process. The solder can then be brought to the liquid or pasty state, and a non-eutectic soldering paste is advantageously used for this purpose. Through the use of this method step, it is simple for single solder applications or for several or all of them, to be simultaneously pressed flat on the PCB. The result is a relatively planar, solder layer 3 on the surface of the PCB. Despite the melting, the final shape of the finished solder applications, that is of the layer 3 of FIG. 1, is again comparatively flat. In the cases in which a comparatively planar, largely leveled surface of the solder applications of the soldering pads is not required, further work can be done according to the method of the invention, directly after melting the solder deposits.

Once the solder deposits have been produced and melted, the method of the invention provides for joining components 5 to the PCB 1 with the aid of an adhesive. As is seen in FIG. 2, an adhesive 6 is applied to the PCB 1 between electrically conductive regions that can each be assigned to one component. The component 5 is secured to the PCB 1 with the aid of the adhesive 6. The adhesive 6 is located between the soldering pads 2, which are provided with solder applications as shown in FIG. 1. If the solder application has been performed without using a solder resist mask 4, then the adhesive 6 can be applied directly to the PCB 1. If a solder resist mask 4 was used, then depending on requirements and on the preparation of the solder applications, it can either be removed before the adhesive is applied, or the adhesive can be applied to the regions of the solder resist mask 4 that are located between solder applications and that may each be assigned to one component.

In the embodiment of FIG. 2, either no solder resist mask was used, or a solder resist mask that was used has been removed again. The component 5 can thus be joined directly to the PCB 1 by means of the adhesive 6. The adhesive 6 is either applied first to the PCB 1 and the component 5 is placed on it afterward, or the adhesive is first joined to the component 5, and the component 5 with the adhesive 6 is then placed on the appropriate regions of the PCB 1. Preferably, the component is placed in such a way that the relationship of the leads to be soldered with the soldering pads is optimal in view of the later soldering process. Once the components have been placed, the adhesive 6 is preferably cured, so that a largely stable, firm connection exists between the component 5 and the PCB 1. Depending on the intended purpose, multiple adhesive spots or only one adhesive spot per component may be provided. Just like the soldering paste applied before, the adhesive can also be applied with a mask, for example through a printing process or with a dispenser.

The use of a permanent solder resist mask has the advantage of permitting glued-on components, such as two-pole SMDs, to rest directly on the solder resist or stop mask, so that the adhesive spot or spots can therefore be very small and the adhesive can be applied especially economically. In the case of components with a spacing between a lower surface of a housing and a lead plane or with a bottom spacing to be provided, for instance in the case of integrated SMD circuits, it is simpler to apply the adhesive to the solder stop mask, and this is also more economical than applying it to the PCB, especially since the solder stop mask need not be removed.

Once the component 5 has been firmly joined to the PCB 1, a flux is applied. In the case of components that are problematic to solder, it is possible in the conventional manner to use a flux that is comparatively aggressive and therefore requires washing after the soldering process. On the other hand, since an advantage of the invention is that the flux need not simultaneously hold the component 5 in place, a less aggressive flux can also be used, such as a low solid (LS) flux. It was previously not possible to use such fluxes in the reflow technique. Advantageously, the flux is applied by dipping the PCB along with the components secured to it. Not only the electrical leads of the component and the solder applications but the component itself as well are all moistened with flux. A better soldered connection is thus produced in the later soldering process. Additionally, with PCBs that have components mounted on both sides, both sides can be moistened with flux simultaneously. An advantage of an LS flux is that it need not be washed off again after a soldering process. The flux may also be applied by some other method, such as spraying.

After the flux has been applied, the soldering process is carried out in the usual manner, by heating the solder applications. FIG. 2 shows the soldered connections 7.

The process according to the invention is suitable for all types of PCBs and other base materials. Further processing can be done in the usual ways. The method has the advantage of permitting the prepared PCB to be stored for a comparatively long time, since there are no additional fluxes and adhesive ingredients in the solder applications. As a result, the prepared PCB with the solder applications can be checked without difficulty before the ensuing immersion process. The method also has the advantage of permitting comparatively high solder layers 3 considering the tendency toward finer and finer lead configurations. This is advantageous for tolerance reasons. The thickness of the solder applications 3 may be between 20 and 300 μm. Once the solder applications have been made, it is not only possible to check the PCB, but cleaning may also be provided as needed before further processing.

I claim:

1. A method for applying solder to and mounting components on printed circuit boards, which comprises:
    applying solder deposits to electrically conductive regions of a printed circuit board;
    subsequently melting the solder deposits into solder applications and joining the solder applications to the conductive regions;
    applying force on the solder applications in a direction towards the printed circuit board, simultaneously applying heat and flattening the solder applications;
    joining components to the printed circuit board with an adhesive applied to the printed circuit board between the electrically conductive regions, while assigning each of the electrically conductive regions to a respective one of the components;
    applying a flux; and
    performing a soldering process.

2. The method according to claim 1, which comprises applying the adhesive in the form of one adhesive spot per component.

3. The method according to claim 1, which comprises applying the adhesive with a mask.

4. The method according to claim 1, which comprises applying the adhesive with a dispenser.

5. The method according to claim 1, which comprises joining the components to the printed circuit board by curing the adhesive.

6. The method according to claim 1, which comprises applying the flux by immersion of the printed circuit board having the glued-on components.

7. The method according to claim 1, which comprises applying the flux by spraying the printed circuit board having the glued-on components.

8. The method according to claim 1, which comprises applying a low solid flux.

9. The method according to claim 1, which comprises gluing the components in the form of surface mounted devices to the printed circuit board.

10. The method according to claim 1, which comprises gluing the components in the form of surface mounted devices to a solder resist mask on the printed circuit board.

11. A method for applying solder to and mounting components on printed circuit boards, which comprises:

applying solder deposits to electrically conductive regions of a printed circuit board;

subsequently melting the solder deposits into solder applications and joining the solder applications to the conductive regions;

flattening the solder applications by simultaneously applying force on the solder applications in a direction towards the printed circuit board and applying heat;

joining components which have not been pretinned to the printed circuit board with an adhesive applied to the printed circuit board between the electrically conductive regions, while assigning electrically conductive regions to respective ones of the components;

applying a flux; and performing a soldering process.

* * * * *